United States Patent
Arai

(10) Patent No.: US 11,756,648 B1
(45) Date of Patent: Sep. 12, 2023

(54) SEMICONDUCTOR DEVICE HAVING REDUNDANCY WORD LINES

(71) Applicant: MICRON TECHNOLOGY, INC., Boise, ID (US)

(72) Inventor: Minari Arai, Saitama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/692,049

(22) Filed: Mar. 10, 2022

(51) Int. Cl.
| | |
|---|---|
| *G11C 29/00* | (2006.01) |
| *G11C 29/18* | (2006.01) |
| *G11C 29/36* | (2006.01) |
| *G11C 11/406* | (2006.01) |
| *G11C 29/44* | (2006.01) |
| *G11C 29/12* | (2006.01) |

(52) U.S. Cl.
CPC ...... *G11C 29/785* (2013.01); *G11C 11/40615* (2013.01); *G11C 11/40622* (2013.01); *G11C 29/18* (2013.01); *G11C 29/36* (2013.01); *G11C 29/44* (2013.01); *G11C 2029/1202* (2013.01)

(58) Field of Classification Search
CPC ............ G11C 29/785; G11C 11/40615; G11C 11/40622; G11C 29/18; G11C 29/36; G11C 29/44; G11C 2029/1202
See application file for complete search history.

(56) References Cited

U.S. PATENT DOCUMENTS

| | | | | |
|---|---|---|---|---|
| 9,171,604 B2* | 10/2015 | Oh | ....................... | G11C 11/4072 |
| 10,734,062 B2* | 8/2020 | Koo | ..................... | G11C 11/4087 |
| 11,056,167 B2* | 7/2021 | Ito | ........................ | G11C 11/4087 |
| 11,232,849 B2* | 1/2022 | Wieduwilt | ............. | G11C 29/42 |

* cited by examiner

*Primary Examiner* — Vanthu T Nguyen
(74) *Attorney, Agent, or Firm* — Dorsey & Whitney LLP

(57) ABSTRACT

Disclosed herein is an apparatus that includes first register circuits configured to store a first address, and a comparing circuit configured to compare the first address with a second address. The comparing circuit includes first and second circuit sections. In a first operation mode, the comparing circuit is configured to activate a match signal when the first circuit section detects that the first bit group of the first address matches with the third bit group of the second address and the second circuit section detects that the second bit group of the first address matches with the fourth bit group of the second address. In a second operation mode, the comparing circuit is configured to activate the match signal when the first circuit section detects that the first bit group matches with the third bit group regardless of the second and fourth bit groups.

11 Claims, 10 Drawing Sheets

FIG. 4

| RR<15:0> | En |
|---|---|
| Row Address of Defective Normal Word Line | 1 |

FIG.9A

| RR<13> | En |
|---|---|
| 0 | 0 |

FIG.9B

| RR<13> | En |
|---|---|
| 1 | 0 |
| Row Address of Defective Redundancy Word Line | |

FIG.9C

SEMICONDUCTOR DEVICE HAVING REDUNDANCY WORD LINES

BACKGROUND

In a semiconductor memory device such as a DRAM, a defective normal word line is replaced by a redundancy word line. However, generally in a refresh operation, a plurality of normal word lines are selected at the same time, so that control of refreshing a redundancy word line instead of a defective normal word line cannot be executed easily. Therefore, in a refresh operation, there is a case of employing a system in which refresh of a defective normal word line is stopped without performing any replacement and all redundancy word lines are refreshed regardless of the use of them. However, in this case, there is a possibility that there are defective redundancy word lines among them. It is not desirable to perform a refresh operation on defective redundancy word lines.

BRIEF DESCRIPTION OF THE DRAWINGS

FIG. 4 is a diagram showing an example of count values of a refresh counter;

FIGS. 9A to 9C are diagrams for explaining bit information stored in a register circuit.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments maybe utilized, and structural, logical, and electrical changes maybe made without departing from the scope of the present disclosure. The various embodiments disclosed herein are not necessary mutually exclusive, as some disclosed embodiments can be combined with one or more other disclosed embodiments to form new embodiments.

Figure 1:
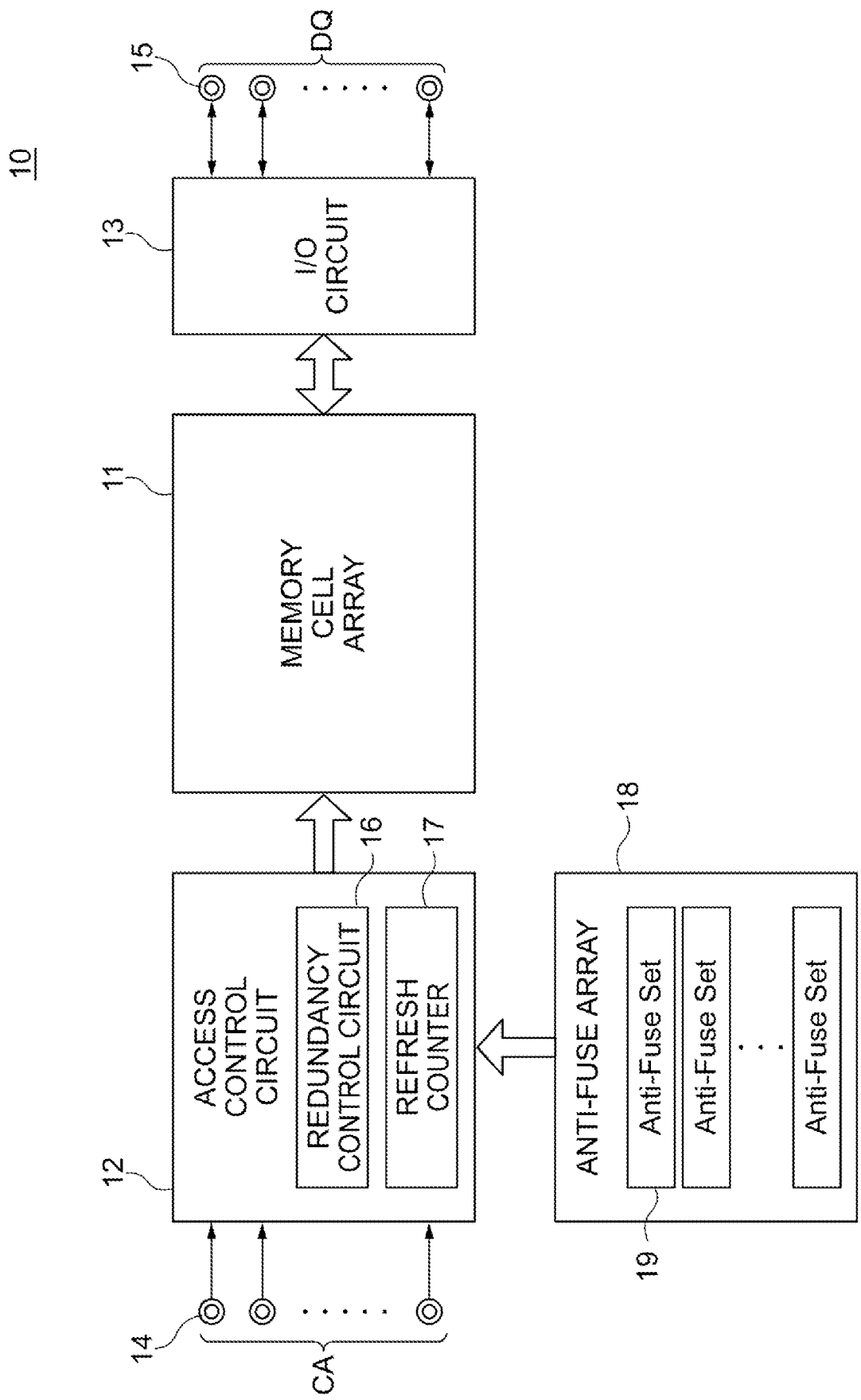
FIG. 1 is a block diagram showing a configuration of a semiconductor device according to an embodiment of the present disclosure.

FIG. 1 is a block diagram showing a configuration of a semiconductor device 10 according to the present disclosure. The semiconductor device 10 shown in FIG. 1 is a DRAM, for example, and includes a memory cell array 11, an access control circuit 12 that performs access to the memory cell array 11, and an I/O circuit 13 that performs input and output of data to and from the memory cell array 11. The access control circuit 12 performs access to the memory cell array 11 based on a command address signal CA input from an external controller via command address terminals 14. In a read operation, data DQ read from the memory cell array 11 is output to data I/O terminals 15 via the I/O circuit 13. In a write operation, data DQ input from an external controller to the data I/O terminals 15 is written in the memory cell array 11 via the I/O circuit 13. The access control circuit 12 includes a redundancy control circuit 16 and a refresh counter 17. When the power of the semiconductor device 10 is turned on, defective address data having been written in an anti-fuse array 18 is transferred to the redundancy control circuit 16. The anti-fuse array 18 includes a plurality of anti-fuse sets 19.

Figure 2:
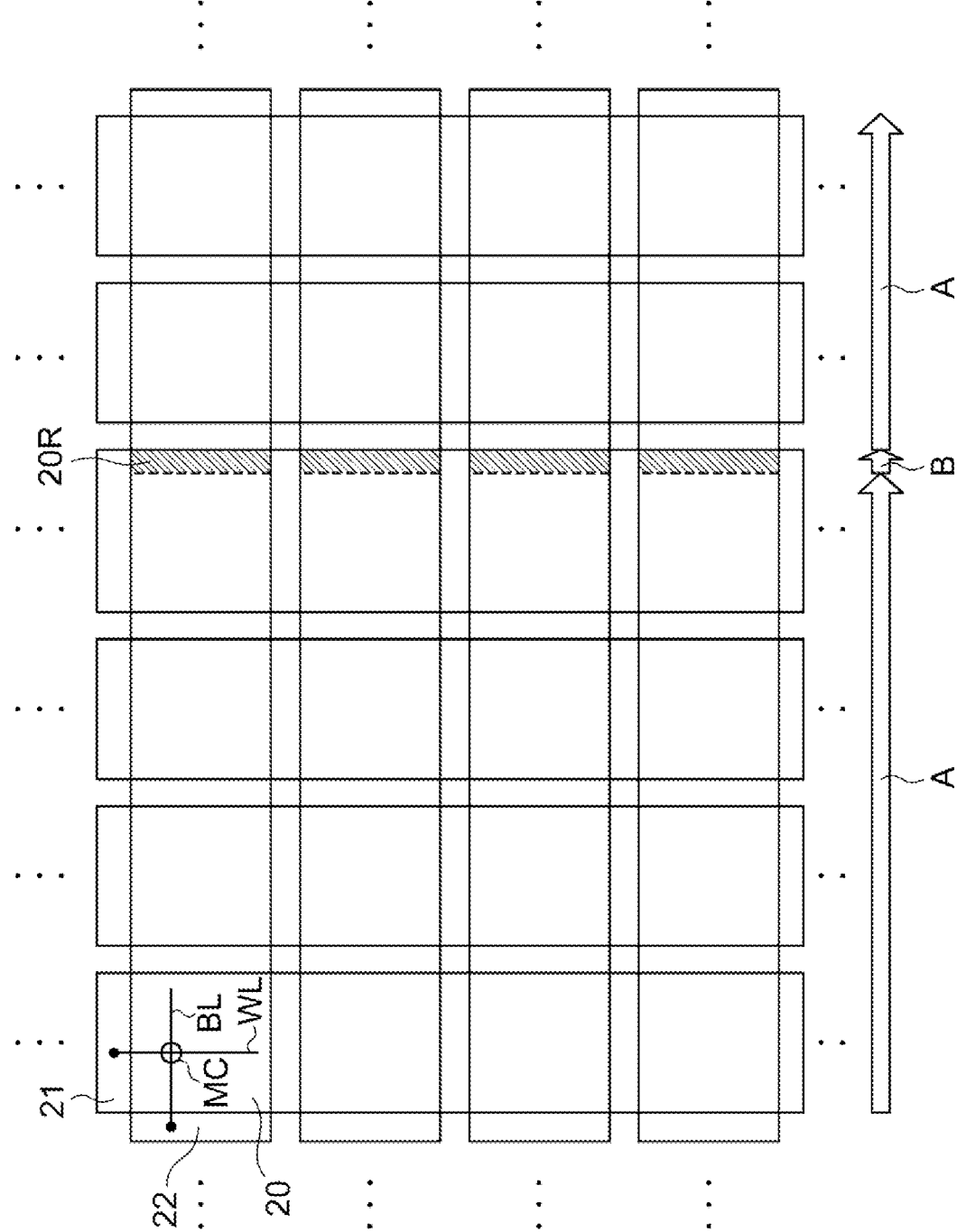
FIG. 2 is a schematic diagram for explaining a configuration of a memory cell array.
Figure 3:
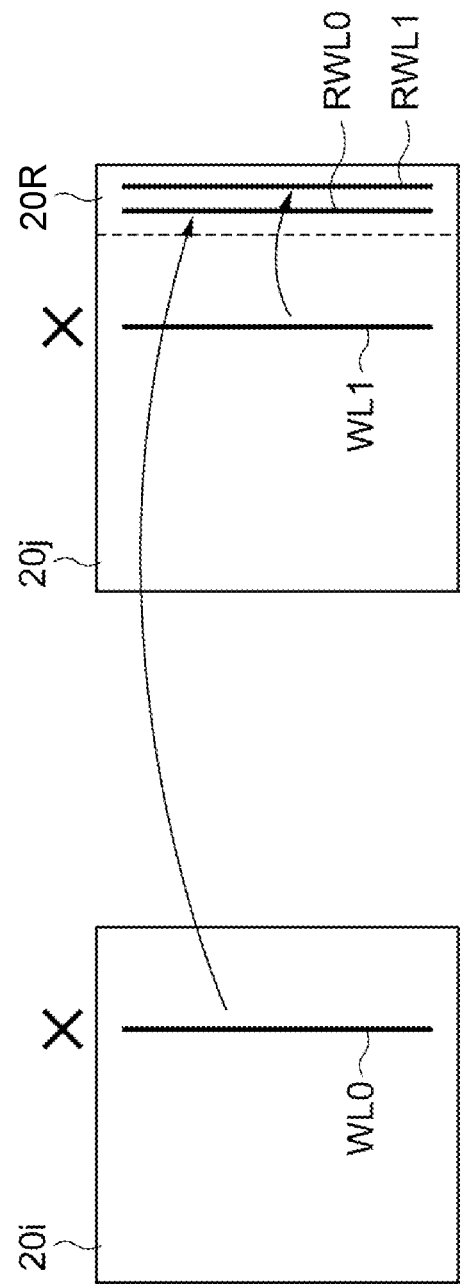
FIG. 3 is a schematic diagram for explaining a state where a defective normal word line is replaced by a redundancy word line.

FIG. 2 is a schematic diagram for explaining a configuration of the memory cell array 11. As shown in FIG. 2, the memory cell array 11 includes a plurality of memory mats 20 that are arranged in a matrix. Each of the memory mats 20 includes a plurality of word lines WL and a plurality of bit lines BL, and a memory cell MC is arranged on the intersection of these lines. The word lines WL are driven by a word driver 21. The potential generated in the bit line BL is amplified by a sense amplifier 22. A redundancy region 20R is included in some of the memory mats 20. As shown in FIG. 3, the redundancy region 20R includes a plurality of redundancy word lines RWL. A defective word line WL is replaced by a redundancy word line RWL. The example shown in FIG. 3 represents a state where a defective word line WL0 included in a memory mat 20$i$ is replaced by a redundancy word line RWL0 included in a memory mat 20$j$, and a defective word line WL1 included in the memory mat 20$j$ is replaced by a redundancy word line RWL1 included in the memory mat 20$j$.

Here, in a case where the command address signal CA indicates an active command, a certain word line WL is selected based on a row address input from an external controller with the active command. At this time, when the row address indicates a defective word line WL, a redundancy word line RWL is selected instead of the word line WL indicated by the row address. As an example, the mw address has a 16-bit configuration. Meanwhile, when the command address signal CA indicates a refresh command, a refresh address is generated by the refresh counter 17. Subsequently, a refresh operation is performed on the word line WL or the redundancy word line RWL indicated by the refresh address. As an example, the refresh address has a 14-bit configuration.

Figure 4:
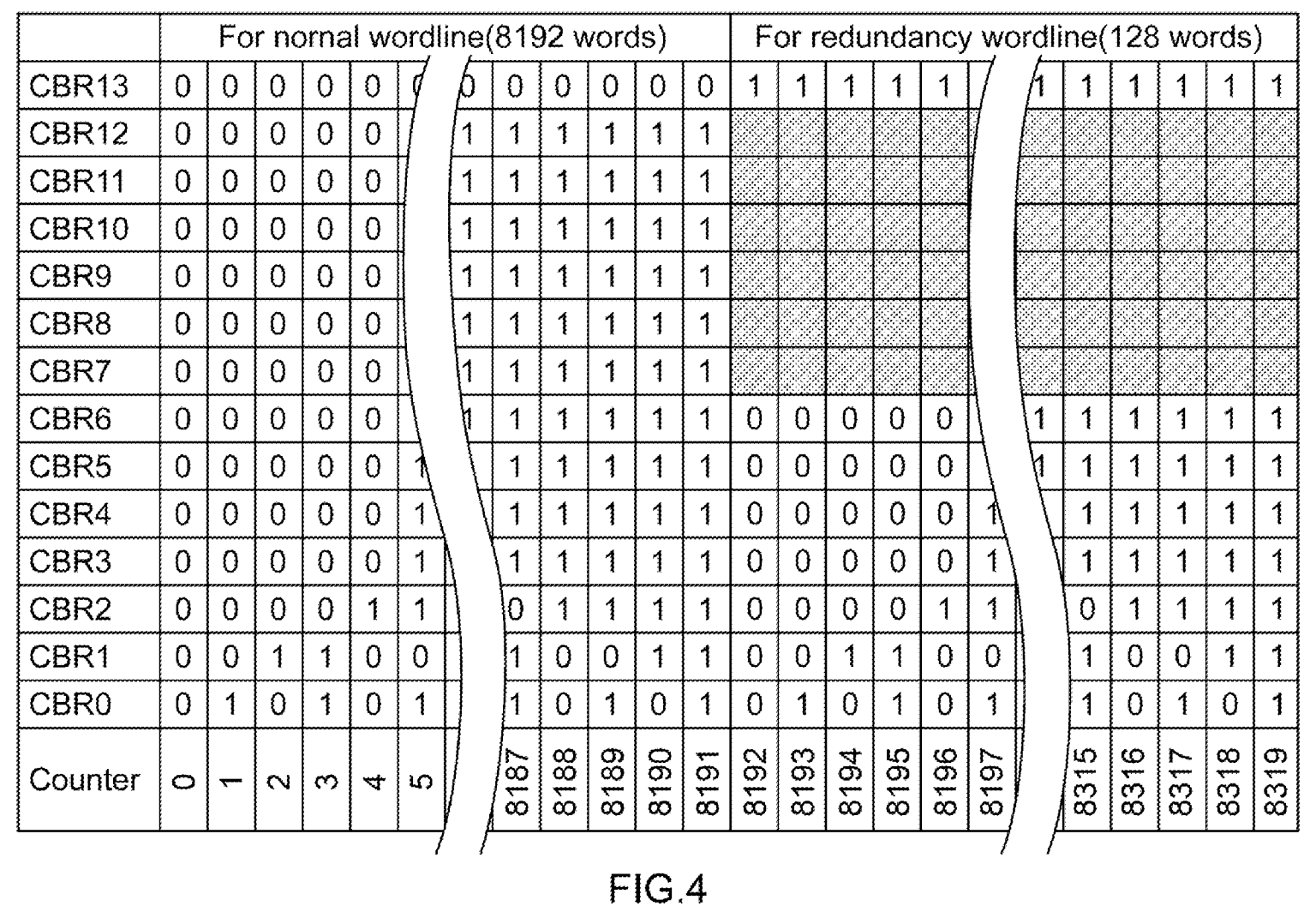

FIG. 4 is a diagram showing an example of count values of the refresh counter 17. Each of the count values of the refresh counter 17 is incremented each time a refresh command is issued. In the example shown in FIG. 4, the refresh address has a 14-bit configuration constituted by CBR<13:0>. Among these bits, CBR<12:0> that is a lower-order 13 bit is a real address, and CBR<13> that is a highest-order bit is used as a signal for selecting whether refreshing either a normal word line WL or a redundancy word line RWL. When the highest-order bit CBR<13> indicates 0, a normal word line WL is selected and the highest-order bit CBR<13> indicates 1, a redundancy word line RWL is selected. In a case where the highest-order bit CBR<13> indicates 1, the refresh address has a 7-bit configuration constituted by CBR<6:0>. Therefore, when the highest-order bit CBR<13> indicates 0, addresses of 8192 patterns are expressed with CBR<12:0>, and when the highest-order bit CBR<13> indicates 1, addresses of 128 patterns are expressed with CBR<6:0>. The maximum value of count values of the refresh counter 17 is 8319, and when the value reaches 8319, it subsequently returns to 0. With this process, after word lines WL as refresh operation targets are selected in the order of an arrow A shown in FIG. 2, redundancy word lines RWL are selected in the order of an arrow B. Here, when the row address has a 16-bit configuration, the refresh address CBR<12:0> with the real address thereof having a 13-bit configuration is in a state where the higher-order three bits of the row address are degenerated. Therefore, each time a refresh address is updated, eight word lines WL or eight redundancy word lines RWL are selected at the same time.

Figure 5:
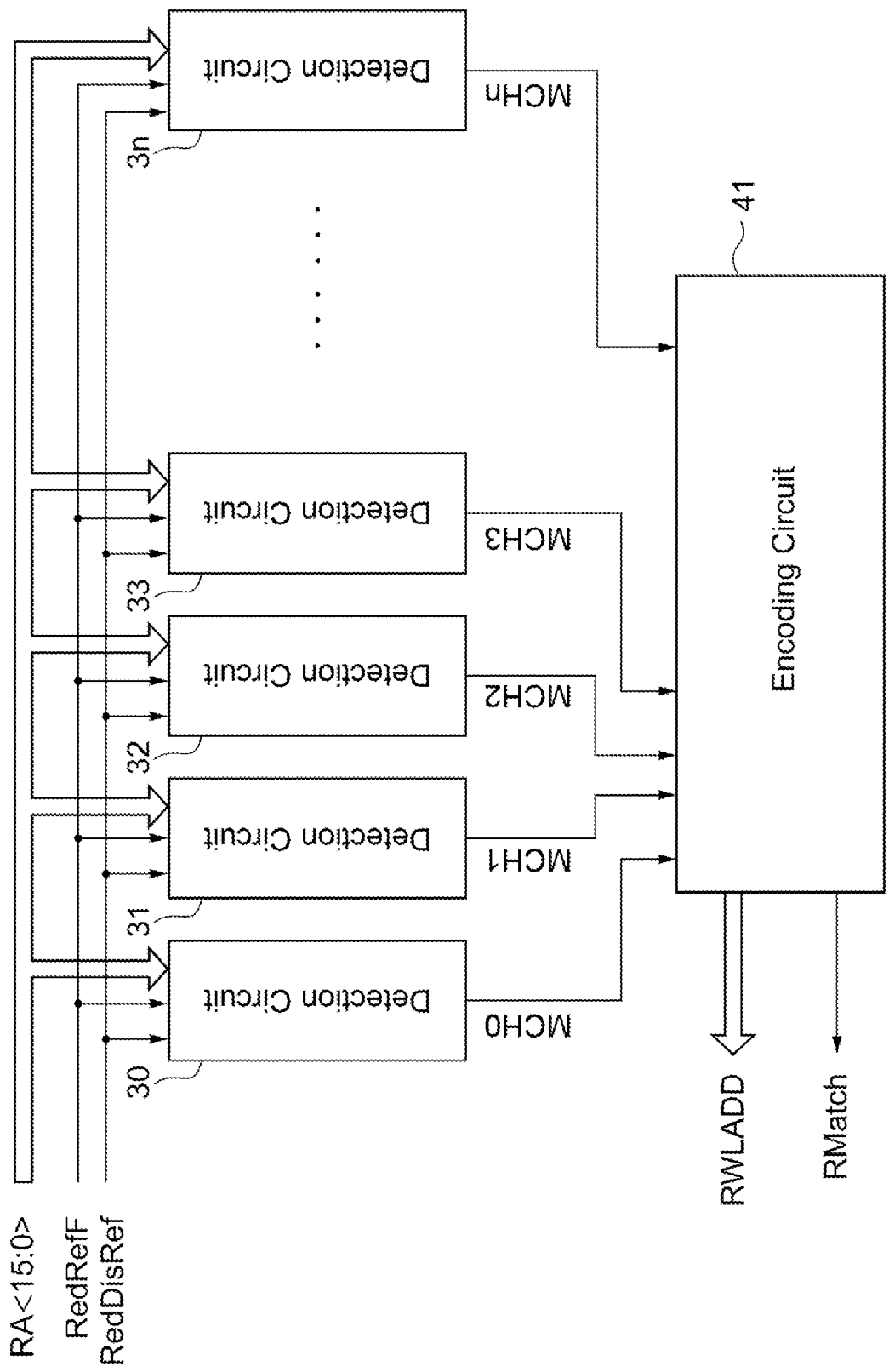
FIG. 5 is a block diagram showing a configuration of a redundancy control circuit.

FIG. 5 is a block diagram showing a configuration of the redundancy control circuit 16. As shown in FIG. 5, the redundancy control circuit 16 includes a plurality of detection circuits 30 to 3n and an encoding circuit 41 that receives match signals MCH0 to MCHn respectively output from the detection circuits 30 to 3n. The detection circuits 30 to 3n are respectively assigned to corresponding ones of redundancy word lines RWL. Therefore, when there are 128 redundancy word lines RWL, 128 sets of detection circuits 30 to 3n are provided. A row address RA<15:0> is commonly supplied to a plurality of detection circuits 30 to 3n. In a refresh operation on a normal word address WL, higher-order three bits RA<15:13> of an internally generated row address are added to the refresh address CBR<12:0>. The higher-order three bits RA<15:13> of the row address to be added to the refresh address CBR<12:0> are continuously incremented before starting a refresh operation, thereby sequentially adding eight patterns from b000 to b111. In a refresh operation on a redundancy word line RWL, the refresh addresses CBR<13> and CBR<6:0> are used as row addresses RA as they are. The encoding circuit 41 generates an address RWLADD of the redundancy word line RWL and a refresh stop signal RMatch based on the match signals MCH0 to MCHn.

Figure 6:
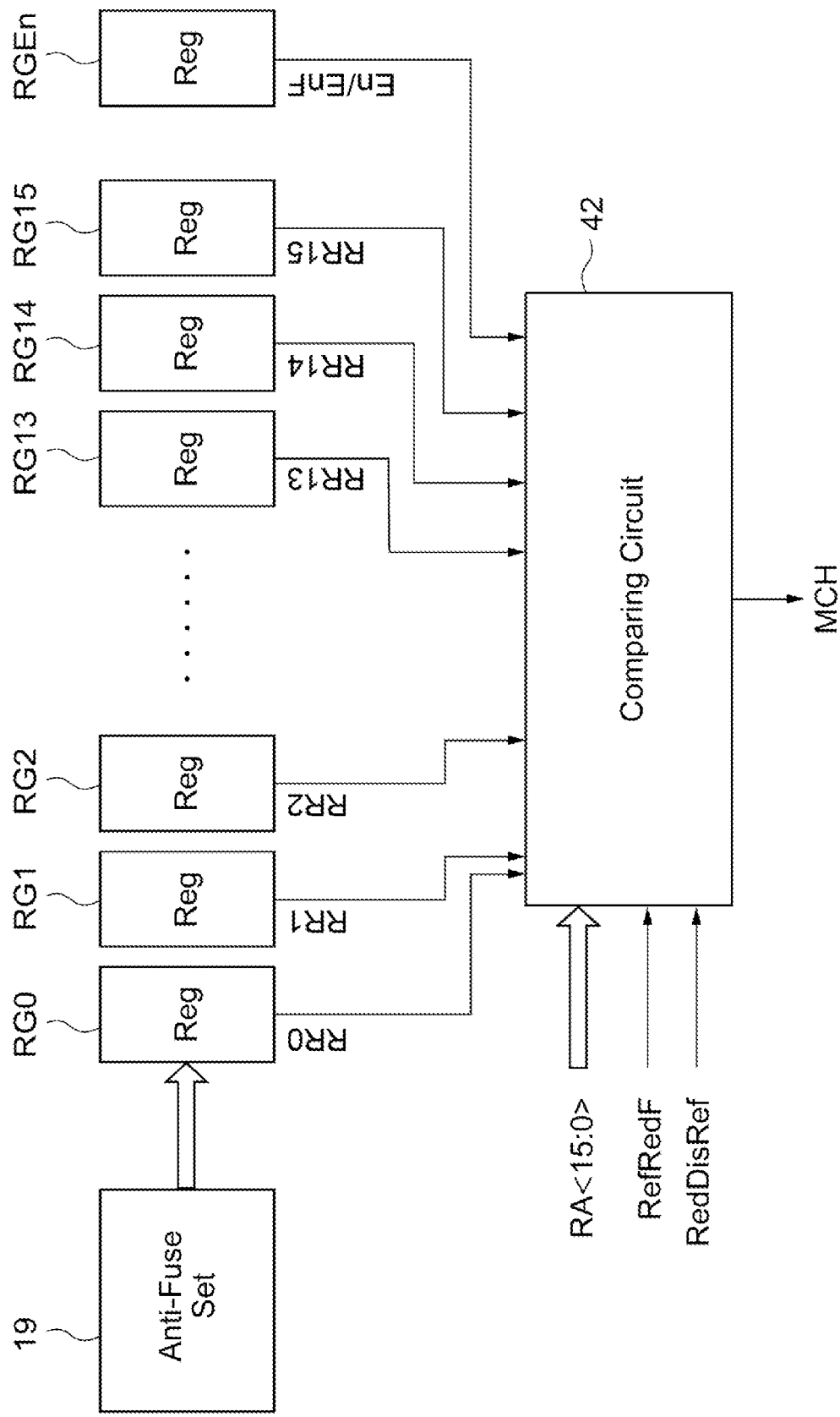
FIG. 6 is a block diagram showing a configuration of a detection circuit.

FIG. 6 is a block diagram showing a configuration of the detection circuit 30. As shown in FIG. 6, the detection circuit 30 includes register circuits RG0 to RG15 that respectively store therein corresponding one of address bits RR0 to RR15, a register circuit RGEn that stores therein an enable bit En, and a comparing circuit 42 that compares the address bits RR0 to RR15 and the row address RA<15:0>. The address bits RR0 to RR15 and the enable bit En to be respectively stored in the register circuits RG0 to RG15 and RGEn are transferred from corresponding ones of anti-fuse sets 19 at the time of initialization after turning on the power of the semiconductor device 10. Here, the enable bit En is set to be enable (=1) when a corresponding redundancy word line RWL is used for a replacing operation. In this case, the row address RA of a defective word line WL, which is a replacement source, is stored in the register circuit RG0 to RG15. Meanwhile, when the corresponding redundancy word line RWL is not used for a replacing operation and when the corresponding redundancy word line RWL is defective, the enable bit En is set to be disable (=0). When the corresponding redundancy word line RWL is defective, the row address RA of the defective redundancy word line RWL is stored in the register circuits RG0 to RG6. The detection circuits 31 to 3n shown in FIG. 6 also have the same circuit configuration as that of the detection circuit 30.

Figure 7:
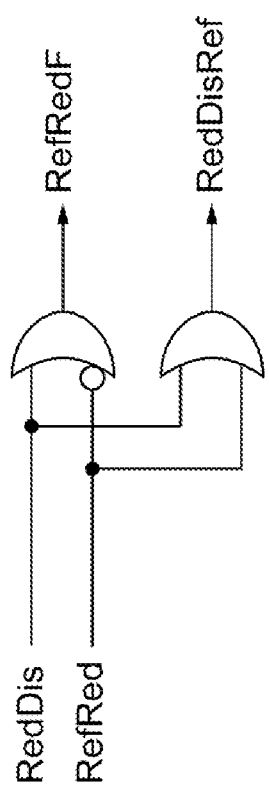
FIG. 7 is a circuit diagram showing a circuit that generates status signals.

Status signals RefRedF and RedDisRef are also input to the comparing circuit 42. The status signals RefRedF and RedDisRef are generated by the circuit shown in FIG. 7. As shown in FIG. 7, the status signals RefRedF and RedDisRef are generated with a disable signal RedDis and a status signal RefRed. The disable signal RedDis is a type of test signals, and as the disable signal RedDis is set to be a high level, a replacing operation of word lines by the redundancy control circuit 16 is prohibited. The status signal RefRed is a signal that becomes a high level during a period where the redundancy word line RWL is refreshed in a refresh operation. Normally, the disable signal RedDis is in a low level, and in this case the status signal RefRedF is in an inverted level of that of the status signal RefRed, and the status signal RedDisRef has the same level as that of the status signal RefRed.

Figure 8:
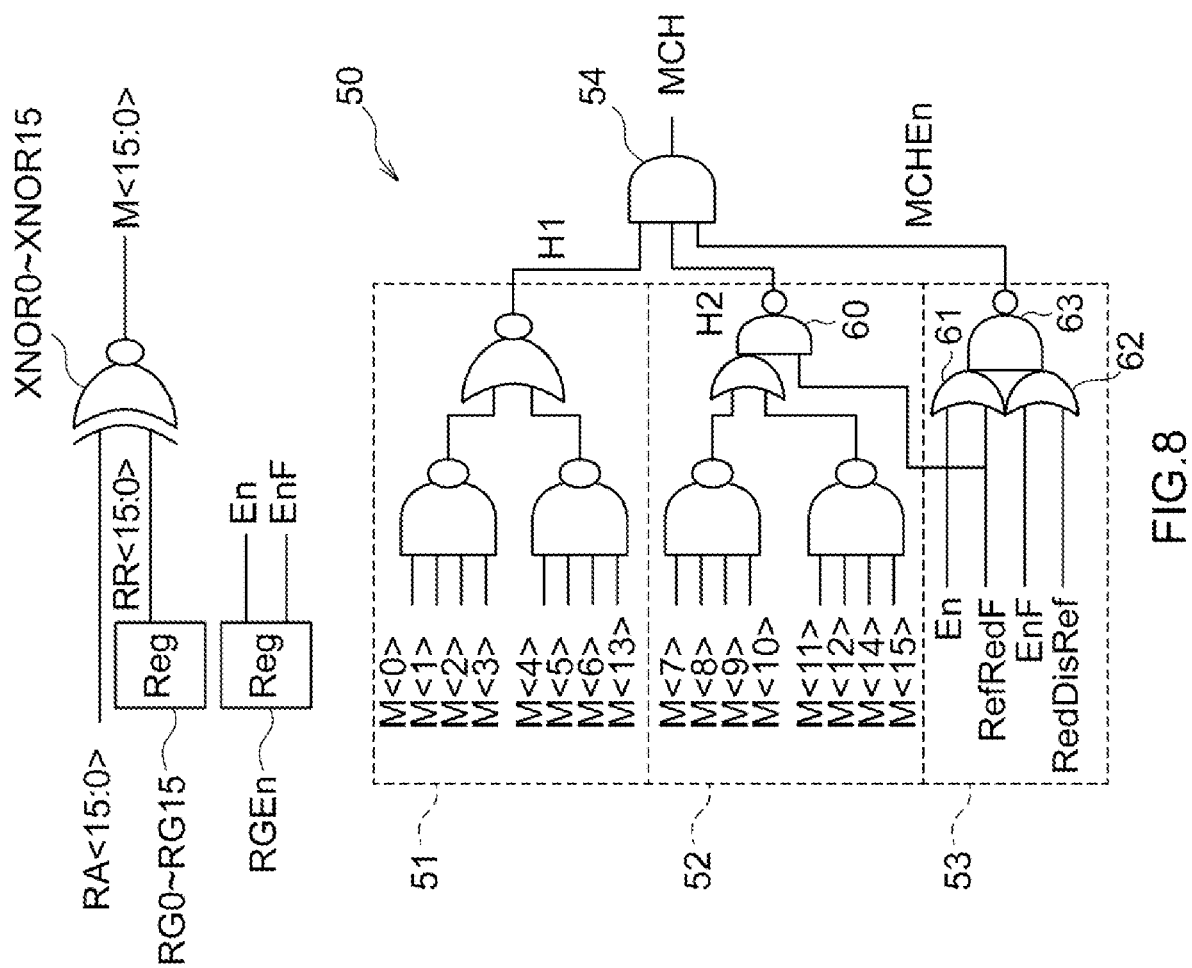
FIG. 8 is a circuit diagram of a comparing circuit.

FIG. 8 is a circuit diagram of the comparing circuit 42. As shown in FIG. 8, the comparing circuit 42 includes exclusive NOR gate circuits XNOR0 to XNOR15 that respectively generate a bit match signal M<15:0> by comparing each bit of a mw address RR<15:0> stored in the register circuits RG0 to RG15 and each bit of the row address RA<15:0>, and a logical gate circuit 50 that generates a match signal MCH (any of MCH0 to MCHn) based on the bit match signal M<15:0>. The logical gate circuit 50 includes a first circuit section 51, a second circuit section 52, a third circuit section 53, and an AND gate circuit 54. The first circuit section 51 receives bit match signals M<13> and M<6:0> and when these signals are in a high level, a hit signal H1 is activated to be a high level. Eight bits of row addresses RA<13> and RA<6:0> corresponding to the bit match signals M<13> and M<6:0> constitute a first bit group of a row address RA. The second circuit section 52 receives bit match signals M<15:14> and M<12:7> and when these signals are in a high level, a hit signal H2 is activated to be a high level. Eight bits of row addresses RA<15:14> and RA<12:7> corresponding to the bit match signals M<15:14> and M<12:7> constitute a second bit group of a row address RA. A NAND gate circuit 60 that receives the status signal RefRedF is provided in the final stage of the second circuit section 52. With this configuration, when the status signal RefRedF is at a low level, the hit signal H2 becomes a high level regardless of the bit match signals M<15:14> and M<12:7>. The third circuit section 53 includes an OR gate circuit 61 that receives an enable signal En and the status signal RefRedF, an OR gate circuit 62 that receives an inverted enable signal EnF and the status signal RedDisRef, and a NAND gate circuit 63 that receives outputs from the OR gate circuits 61 and 62 to generate an enable signal MCHEn. Subsequently, when the hit signals H1 and H2 and the enable signal MCHEn are all in a high level, the match signal MCH output from the AND gate circuit 54 is activated to be a high level.

As described above, the enable bit En is set to be a high level when a corresponding redundancy word line RWL is used for a replacing operation. In this case, as shown in FIG. 9A, the row address RR<15:0> that is the same as the row address RA<15:0> of a defective word line WL, which is a replacement source, is stored in the register circuits RG0 to RG15. With this process, when the row address RA<15:0> input from an external controller with an active command matches the row address RR<15:0> stored in any of the detection circuits 30 to 3n, a corresponding match signal MCH is activated. In response thereto, the encoding circuit 41 generates an address RWLADD of a redundancy word line RWL corresponding to the activated match signal MCH. As a result, a redundancy word line RWL indicated by the address RWLADD is selected instead of the word line WL indicated by the input row address RA<15:0>. Meanwhile, in a refresh operation, three bits are added to higher-bits of the refresh address CBR<12:0> output from the refresh counter 17, thereby generating a 16-bit row address RA<15:0>. The higher-order three bits of the row address change from b000 to b111, and thus eight types of mw addresses RA<15:0> are generated sequentially. Subsequently, when one or two or more addresses among the eight types of mw addresses RA<15:0> match the row address RR<15:0> stored in any of the detection circuits 30 to 3*n*, a corresponding match signal MCH is activated. In response thereto, the encoding circuit 41 activates the refresh stop signal RMatch and a refresh operation on a corresponding word line WL is canceled. As a result, a refresh operation on a defective word line WL is not performed.

Meanwhile, in a case where a corresponding redundancy word line RWL is not used for a replacing operation and where the corresponding redundancy word line RWL is defective, the enable bit En is set to be a low level. Here, in a case where the corresponding redundancy word line RWL is not used for a replacing operation, as shown in FIG. 9B, a bit RR<13> stored in the register circuit RG13 is set to be a low level. As a result, the match signal MCH is not activated regardless of the value of the row address RA<15:0> input from an external controller with an active command and the value of the refresh address CBR<13:0> that is generated in a refresh operation. Accordingly, the corresponding redundancy word line RWL becomes an unused state. Meanwhile, in a case where the corresponding redundancy word line RWL is defective, as shown in FIG. 9C, the bit RR<13> stored in the register circuit RG13 is set to be a high level, and a row address RR<6:0> that is the same as the row address RA<6:0> of a defective redundancy word line RWL is stored in the register circuits RG0 to RG6. Here, during a period where the redundancy word line RWL is refreshed (RefRedF, CBR<13>=1), the hit signal H2 becomes a high level regardless of the bit match signals M<15:14> and M<12:7>, and thus when the refresh address CBR<6:0> and the row address RR<6:0> match each other, the match signal MCH is activated regardless of the remaining address bits RA<15:14> and RA<12:7>. In response thereto, the encoding circuit 41 activates the refresh stop signal RMatch and a refresh operation on a corresponding redundancy word line RWL is canceled. As a result, a refresh operation on a defective redundancy word line WL is not performed.

Figure 10:
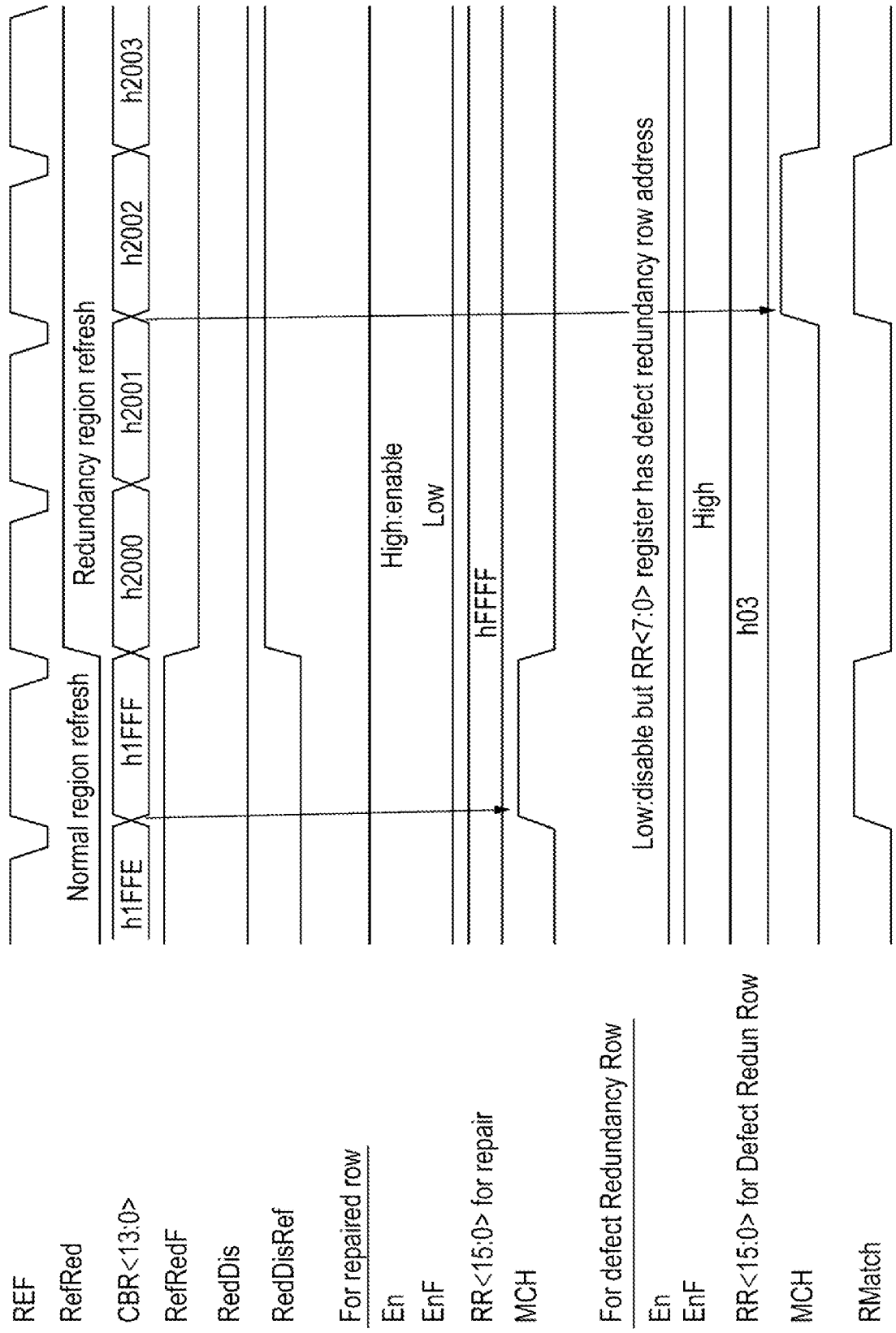
FIG. 10 is a timing chart showing changes in various signals in a refresh operation.

FIG. 10 is a timing chart showing changes in various signals in a refresh operation. As shown in FIG. 10, each time a refresh command REF is issued from outside, the refresh address CBR<13:0> generated by the refresh counter 17 is updated. During a period where the refresh address CBR<13> is 0, that is, a period where a normal word line WL is refreshed, the status signal RefRed becomes a low level. During a period where the refresh address CBR<13> is 1, that is, a period where a redundancy word line RWL is refreshed, the status signal RefRed becomes a high level. In the example shown in FIG. 10, the value of the row address RR<15:0> stored in any of the detection circuit 30 to 3*n* is hFFFF, and its corresponding enable signal En is a high level. In this case, when the value of CBR<12:0> reaches the maximum value, which is h1FFF, at a timing when the higher-order three bits of a row address to be added to CBR<12:0> become b111, the match signal MCH is activated. In response thereto, the refresh stop signal RMatch is activated and a refresh operation on a corresponding word line WL is canceled. Further, in the example shown in FIG. 10, the value of the row address RR<6:0> stored in any of the detection circuits 30 to 3*n* is h03, and its corresponding enable signal En is a low level. In this case, when the value of CBR<6:0> becomes h03, the match signal MCH is activated. In response thereto, the refresh stop signal RMatch is activated and a refresh operation on a corresponding redundancy word line RWL is canceled.

As described above, according to the semiconductor device 10 of the present disclosure, a refresh operation on defective word lines WL and defective redundancy word lines RWL is not performed, and thus erroneous operations can be prevented from happening. In order to realize this prevention, in a test process performed at a manufacturing stage, the mw address RA<15:0> of a defective word line WL is written in any of the anti-fuse sets 19 and the row address RA<6:0> of a defective redundancy word line RWL is written in the anti-fuse set 19 assigned to the corresponding redundancy word line RWL. Subsequently, when the row address RA<15:0> of the defective word line WL is written in the anti-fuse set 19, its corresponding enable signal En is set to be a high level. Meanwhile, when the row address RA<6:0> of the defective redundancy word line RWL is written in the anti-fuse set 19, its corresponding enable signal En is set to be a low level and a row address RR<13> is set to be a high level.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
  a plurality of first register circuits each configured to store a corresponding one of a plurality of bits of a first address, the plurality of bits of the first address being grouped into a first bit group and a second bit group; and
  a comparing circuit configured to compare the first address stored in the plurality of first register circuits with a second address, a plurality of bits of the second address being grouped into a third bit group and a fourth bit group,
  wherein the comparing circuit includes a first circuit section configured to compare each bit of the first bit group with an associated bit of the third bit group and a second circuit section configured to compare each bit of the second bit group with an associated bit of the fourth bit group,
  wherein, in a first operation mode, the comparing circuit is configured to activate a match signal when the first circuit section detects that the first bit group matches with the third bit group and the second circuit section detects that the second bit group matches with the fourth bit group, and
  wherein, in a second operation mode, the comparing circuit is configured to activate the match signal when the first circuit section detects that the first bit group matches with the third bit group regardless of the second and fourth bit groups.

2. The apparatus of claim 1, further comprising a second register circuit configured to store an enable bit,
   wherein the comparing circuit is configured to receive a status signal and be brought into the first operation mode when the enable bit is activated and the status signal is in a first state.

3. The apparatus of claim 2, wherein the comparing circuit is configured to be brought into the second operation mode when the enable bit is deactivated and the status signal is in a second state.

4. The apparatus of claim 3, wherein the comparing circuit is configured to deactivate the match signal regardless of the first and second addresses in a third operation mode.

5. The apparatus of claim 4, wherein the comparing circuit is configured to be brought into the third operation mode when the enable bit is deactivated and the status signal is in the first state.

6. The apparatus of claim 5, wherein the comparing circuit is configured to be brought into the third operation mode when the enable bit is activated and the status signal is in the second state.

7. The apparatus of claim 6, further comprising a memory cell array including a plurality of normal word lines,
   wherein the second address is supplied from outside along with an active command to select one of the normal word lines, and
   wherein the status signal is brought into the first state responsive to the active command.

8. The apparatus of claim 7,
   wherein the memory cell array further includes a redundancy word line, and
   wherein the redundancy word line is selected instead of the one of the normal word lines responsive to the active command when the match signal is activated.

9. The apparatus of claim 8, further comprising a refresh counter configured to generate the second address responsive to a refresh command,
   wherein the status signal is brought into the first state when the second address generated by the refresh counter indicates at least one of the normal word lines, and
   wherein the status signal is brought into the second state when the second address generated by the refresh counter indicates the redundancy word line.

10. The apparatus of claim 9,
    wherein a refresh operation is performed on the at least one of the normal word lines corresponding to the second address generated by the refresh counter when the status signal is in the first state and the match signal is not activated, and
    wherein the refresh operation is not performed on the one of the normal word lines corresponding to the second address generated by the refresh counter when the status signal is in the first state and the match signal is activated.

11. The apparatus of claim 10,
    wherein the refresh operation is performed on the redundancy word lines corresponding to the second address generated by the refresh counter when the status signal is in the second state and the match signal is not activated, and
    wherein the refresh operation is not performed on the redundancy word lines corresponding to the second address generated by the refresh counter when the status signal is in the second state and the match signal is activated.

* * * * *